(12) United States Patent
Xu

(10) Patent No.: US 10,403,702 B2
(45) Date of Patent: Sep. 3, 2019

(54) DOUBLE-SIDED DISPLAY DEVICE, MANUFACTURING METHOD THEREOF, AND ELECTRONIC APPARATUS

(71) Applicant: WUHAN CHINA STAR OPTOELECTRONICS TECHNOLOGY CO., LTD., Wuhan, Hubei (CN)

(72) Inventor: Chao Xu, Hubei (CN)

(73) Assignee: Wuhan China Star Optoelectronics Technology Co., Ltd., Wuhan, Hubei (CN)

(*) Notice: Subject to any disclaimer, the term of this patent is extended or adjusted under 35 U.S.C. 154(b) by 0 days.

(21) Appl. No.: 15/571,218

(22) PCT Filed: Jul. 13, 2017

(86) PCT No.: PCT/CN2017/092707
§ 371 (c)(1),
(2) Date: Nov. 1, 2017

(87) PCT Pub. No.: WO2018/227677
PCT Pub. Date: Dec. 20, 2018

(65) Prior Publication Data
US 2018/0366527 A1    Dec. 20, 2018

(30) Foreign Application Priority Data

Jun. 14, 2017  (CN) .......................... 2017 1 0445917

(51) Int. Cl.
*H01L 27/32*    (2006.01)
*H01L 51/50*    (2006.01)
*H01L 51/56*    (2006.01)

(52) U.S. Cl.
CPC ...... *H01L 27/3267* (2013.01); *H01L 27/3211* (2013.01); *H01L 51/508* (2013.01); *H01L 51/56* (2013.01); *H01L 2227/323* (2013.01)

(58) Field of Classification Search
CPC . H01L 27/3267; H01L 51/56; H01L 27/3211; H01L 51/508; H01L 2227/323
See application file for complete search history.

(56) References Cited

U.S. PATENT DOCUMENTS

2006/0006792 A1* 1/2006 Strip .................. H01L 27/3209
  313/500
2007/0114522 A1   5/2007 Kwok et al.
(Continued)

FOREIGN PATENT DOCUMENTS

CN    1805149 A    7/2006
CN  102342180 A    2/2012
(Continued)

*Primary Examiner* — Mohammed R Alam
(74) *Attorney, Agent, or Firm* — Mintz Levin Cohn Ferris Glovsky and Popeo, P.C.; Kongsik Kim; Jhongwoo Jay Peck

(57) ABSTRACT

The present disclosure provides a double-sided display device which includes a first OLED display panel and a second OLED display panel, of which display surfaces are disposed facing away from each other, wherein the first and second OLED display panels have a common shared cathode layer; the first OLED display panel includes a first electron transport layer, a first emissive layer, a first hole transport layer, a first anode layer and a first array substrate that are sequentially laminated on a first surface of the shared cathode layer; and the second OLED display panel includes a second electron transport layer, a second emissive layer, a second hole transport layer, a second anode layer and a second array substrate that are sequentially laminated on a second surface of the shared cathode layer. The present disclosure further provides a manufacturing method of the
(Continued)

double-sided display device as mentioned above. In comparison with the prior art, the present disclosure obtains a lighter and thinner double-sided display device.

8 Claims, 6 Drawing Sheets

(56) References Cited

U.S. PATENT DOCUMENTS

| | | | | |
|---|---|---|---|---|
| 2014/0145161 A1* | 5/2014 | Naijo | ................. | H01L 51/0097 |
| | | | | 257/40 |
| 2014/0167626 A1* | 6/2014 | Kim | ................... | H01L 27/3267 |
| | | | | 315/161 |
| 2016/0343791 A1* | 11/2016 | Liu | ...................... | H01L 51/524 |

FOREIGN PATENT DOCUMENTS

| | | | |
|---|---|---|---|
| CN | 103872251 A | 6/2014 | |
| CN | 105807513 A | 7/2016 | |

* cited by examiner

DOUBLE-SIDED DISPLAY DEVICE, MANUFACTURING METHOD THEREOF, AND ELECTRONIC APPARATUS

CROSS-REFERENCES TO RELATED APPLICATIONS

This application is a U.S. national phase application, pursuant to 35 U.S.C. § 371, of PCT/CN2017/092707, filed Jul. 13, 2017, designating the United States, which claims priority to Chinese Application No. 201710445917.6, filed Jun. 14, 2017. The entire contents of the aforementioned patent applications are incorporated herein by this reference.

TECHNICAL FIELD

The present disclosure relates to a technical field of flat-panel display, and more particular, to a double-sided display device and a manufacturing method thereof, and an electronic apparatus including the same.

BACKGROUND ART

Flat-panel display devices have numerous advantages of thin body, power saving, no radiation and so on, and thus are widely applied. The current flat-panel display devices mainly include Liquid Crystal Display (LCD) devices, and Organic Light Emitting Diode (OLED) display devices.

Currently, the forms of electronic products become diversified, and a double-sided display function becomes a significant feature of the electronic products of a new generation. For example, a double-side display device inside a cellphone may display a cellphone main function window on one side, and display time on the other side; and for example, a double-side display is used in public places such that people at both sides of the display can see various presented contents. The double-sided display device produced in the current industry is generally formed by sticking and combining two single display panels, which may be an LCD panel and an OLED panel disposed back-to-back, or two LCD panels disposed back-to-back, or two OLED panels disposed back-to-back.

The double-sided display device formed by sticking and assembling two single display panels back-to-back, of which a structure is thicker and heavier and a manufacturing cost is high, which does not satisfy the requirements for thinness and high cost performance demanded by customers.

SUMMARY

In consideration of the disadvantages existing in the prior art, the present disclosure provides a double-sided display device and a manufacturing method thereof to obtain a lighter and thinner double-sided display device.

In order to achieve the above purpose, the present disclosure adopts the following technical solution:

a double-sided display device includes a first OLED display panel and a second OLED display panel, of which display surfaces are disposed facing away from each other, wherein the first and second OLED display panels have a common shared cathode layer; the first OLED display panel includes a first electron transport layer, a first emissive layer, a first hole transport layer, a first anode layer and a first array substrate that are sequentially laminated on a first surface of the shared cathode layer; and the second OLED display panel includes a second electron transport layer, a second emissive layer, a second hole transport layer, a second anode layer and a second array substrate that are sequentially laminated on a second surface of the shared cathode layer, wherein the second surface is a surface opposite to the first surface.

The second transport layer includes a third electron transport layer and a fourth electron transport layer that are sequentially laminated one another, wherein the third electron transport layer and the fourth electron transport layer are bonded to each other via a transparent electronic adhesive layer.

A thickness of the transparent electronic adhesive layer is 10 to 100 nm.

A material of the transparent electronic adhesive layer is sorbitol or dimethyl sulfoxide (DMSO).

The first array substrate and the second array substrate each is a thin film transistor (TFT) array substrate. The first anode layer and the second anode layer each includes a plurality of anodes disposed in array. The first emissive layer and the second emissive layer each includes a plurality of red emissive units, a plurality of green emissive units and a plurality of blue emissive units disposed in array.

The present disclosure further provides a manufacturing method of a double-sided display device, including the following steps:

providing a first array substrate on which a first anode layer, a first hole transport layer, a first emissive layer, a first electron transport layer and a shared cathode layer are manufactured to be sequentially laminated one another;

providing a second array substrate on which a second anode layer, a second hole transport layer, a second emissive layer and a fourth electron transport layer are manufactured to be sequentially laminated one another;

manufacturing a third electron transport layer on the shared cathode layer; and connecting the fourth electron transport layer to the third electron transport layer, wherein the fourth electron transport layer and the third electron transport layer are laminated and connected to form a second electron transport layer.

The step of bonding and connecting the fourth electron transport layer to the third electron transport layer specifically includes: manufacturing a first transparent electronic adhesive layer on the third electron transport layer; manufacturing a second transparent electronic adhesive layer on the fourth electron transport layer; and pressing the second transparent electronic adhesive layer to the first transparent electronic adhesive layer, and performing high temperature baking to make the first and second transparent electronic adhesive layers fused integrally to form a transparent electronic adhesive layer.

A thickness of the first transparent electronic adhesive layer is 5 to 50 nm, and a thickness of the second transparent electronic adhesive layer is 5 to 50 nm.

A material of each of the first and second transparent electronic adhesive layers is sorbitol or dimethyl sulfoxide (DMSO).

The high temperature baking is performed at a temperature of 80 to 150° C. for 1 to 5 min.

According to the double-sided display device and the manufacturing method thereof provided by the embodiments of the present disclosure, the first OLED display panel and second OLED display panel which are opposite to each other have a shared common cathode layer, thereby obtaining a double-sided display device having the lighter weight and thinner thickness, and the manufacturing process is simple and easily realized, and the manufacturing cost is reduced, so that the requirements for thinness and high cost performance demanded by customers are satisfied.

DETAILED DESCRIPTION OF EXEMPLARY EMBODIMENTS

Figure 1:
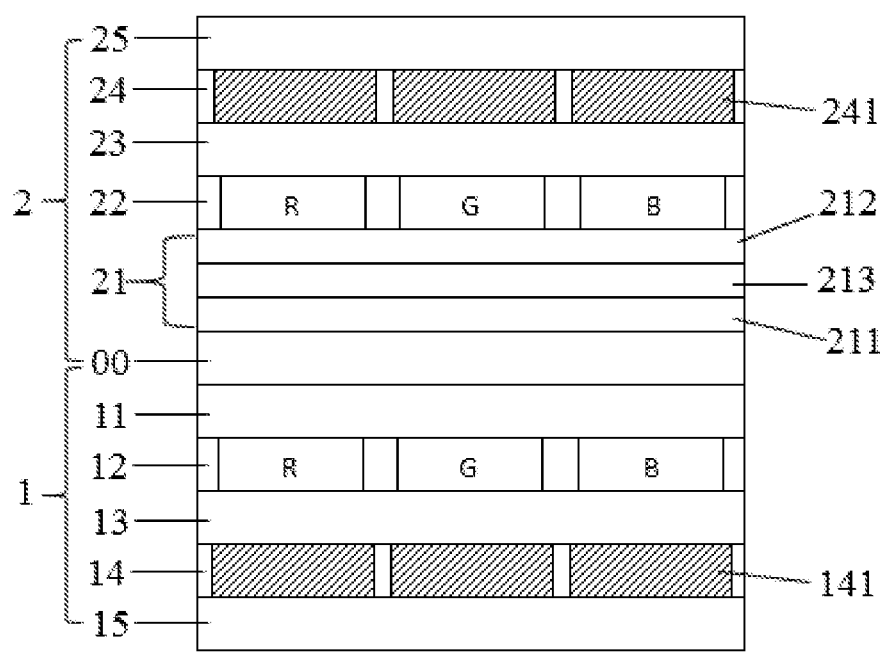
FIG. 1 is a structural diagram of an existing double-sided display device.

In order for the purpose, technical solution and advantages of the present disclosure to be clearer, the embodiments of the present disclosure will be explained in details below in conjunction with the drawings. The examples of the preferred embodiments are exemplified in the drawings. The embodiments of the present disclosure as shown in the drawings and as described according to the drawings are only exemplified, and the present disclosure is not limited to these embodiments.

Here, it is also worthy to explain that, in order to prevent the present disclosure from being obscured due to unnecessary details, the drawings only illustrate the structure and/or processing steps closely related to the solution based on the present disclosure, while other details less related to the present disclosure are omitted.

The present embodiment first provides a double-sided display device. As shown in FIG. 1, the double-sided display device includes a first OLED display panel 1 and a second OLED display panel 2, of which display surfaces are disposed facing away from each other, wherein the first and second OLED display panels 1 and 2 have a common shared cathode layer 00.

Specifically, by referring to FIG. 1, the first OLED display panel 1 includes a first electron transport layer (ETL) 11, a first emissive layer (EML) 12, a first hole transport layer (HTL) 13, a first anode layer 14 and a first array substrate 15 that are sequentially laminated on a first surface of the shared cathode layer 00. The second OLED display panel 2 includes a second electron transport layer (ETL) 21, a second first emissive layer (EML) 22, a second hole transport layer (HTL) 23, a second anode layer 24 and a second array substrate 25 that are sequentially laminated on a second surface of the shared cathode layer 00. The second surface is a surface opposite to the first surface. A light-exiting surface of the first OLED display panel 1 is an upper surface of the first array substrate 15. A light-exiting surface of the second OLED display panel 2 is an upper surface of the second array substrate 25.

The first array substrate 15 and the second array substrate 25 are thin film transistor (TFT) array substrates, respectively. Furthermore, as shown in FIG. 1, the first anode layer 14 and the second anode layer 24 each includes a plurality of anodes 141 and 241 disposed in array, and each of the anodes 141 is electrically connected to a thin film transistor of the TFT array substrate 15, and each of the anodes 241 is electrically connected to a thin film transistor of the TFT array substrate 25. Each of the anodes 141 and 241 serves as a pixel electrode of a sub-pixel. Furthermore, as shown in FIG. 1, the first emissive layer 12 and the second emissive layer 22 each includes a plurality of red emissive units R, a plurality of green emissive units G and a plurality of blue emissive units B disposed in array. Each of the emissive units R, G and B corresponds to a sub-pixel of the corresponding color, that is, the red emissive unit R corresponds to a red sub-pixel, the green emissive unit G corresponds to a green sub-pixel, the blue emissive unit B corresponds to a blue sub-pixel.

According to the double-sided display device provided by the embodiment mentioned above, the first OLED display panel and second OLED display panel which are opposite to each other have a common shared cathode layer, thereby obtaining a double-sided display device having the lighter weight and the thinner thickness.

In the present embodiment, as shown in FIG. 1, the second electron transport layer 21 of the second OLED display panel 2 includes a third electron transport layer 211 and a fourth electron transport layer 212 that are sequentially laminated one another, and the third electron transport layer 211 and the fourth electron transport layer 212 are bonded to each other via a transparent electronic adhesive layer 213.

A thickness of the transparent electronic adhesive layer may be set to be 10 to 100 nm. Specifically, a material of the transparent electronic adhesive layer 213 is preferable to have performances of high transparency and high carrier mobility, which may be selected as sorbitol (D-sorbitol) or dimethyl sulfoxide (DMSO).

Figure 2A:
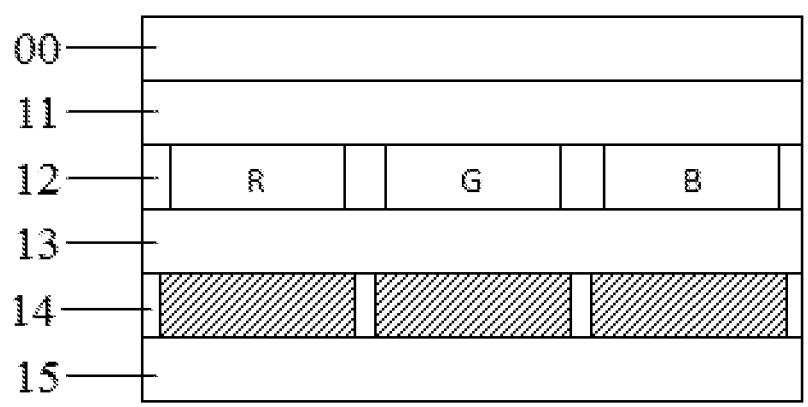
FIGS. 2A-2D are exemplary diagrams of structures of components obtained at respective steps in a manufacturing method of a double-sided display device provided by an embodiment of the present disclosure.

The present disclosure further provides a manufacturing method of the double-sided display device as mentioned above. By referring to FIGS. 2A-2D, the method includes the following steps:

S1: referring to FIG. 2A, providing a first array substrate 15 on which a first anode layer 14, a first HTL 13, a first EML 12, a first ETL 11 and a shared cathode layer 00 are manufactured to be laminated one another by an evaporation process, thereby obtaining a first OLED display panel 1, wherein a material of the shared cathode layer 00 is required to have a high reflectivity, a high conductivity, and a lower work function, such as metal Al.

Figure 2B:
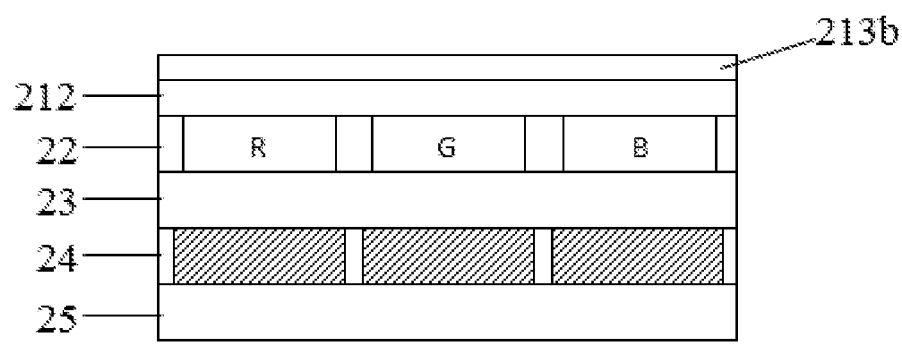

S2: referring to FIG. 2B, providing a second array substrate 25 on which a second anode layer 24, a second HTL 23, a second EML 22 and a fourth ETL 212 are manufactured to be laminated one another by an evaporation process, thereby obtaining a main structure component of a second OLED display panel 2.

Figure 2C:
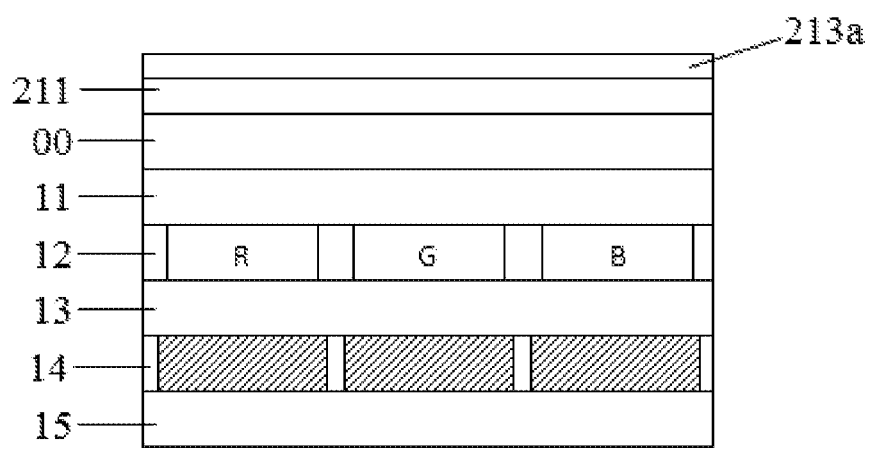

S3: referring to FIG. 2C, manufacturing a third ETL 211 on the shared cathode layer 00, based on the device structure obtained in the step S1.

Figure 2D:
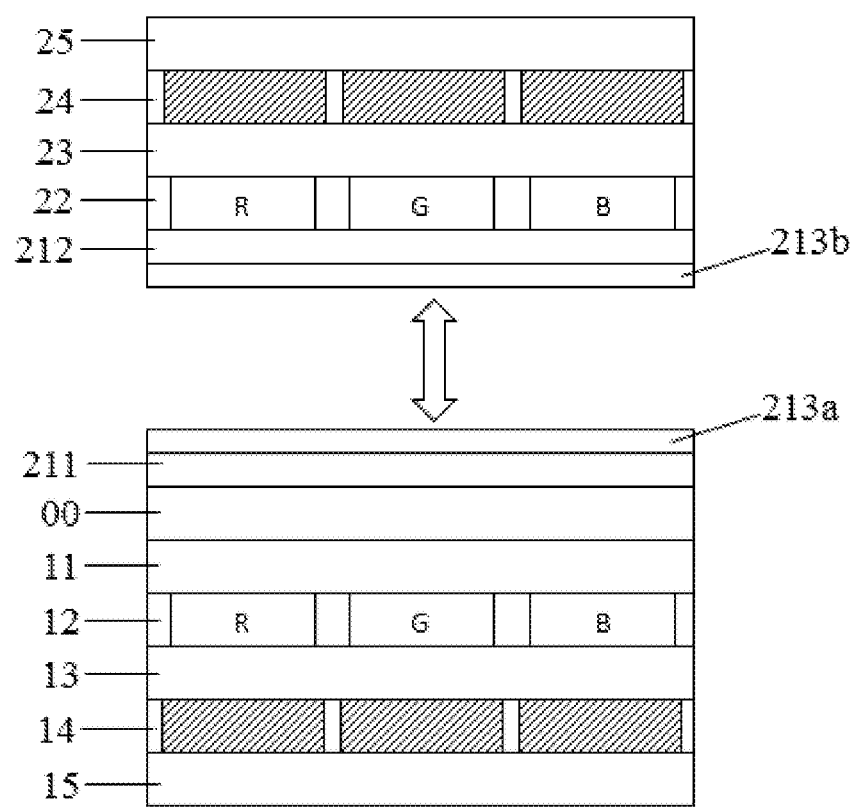

S4: referring to FIG. 2D, based on the device structures obtained in steps S2 and S3, connecting the fourth ETL 212 to the third ETL 211 to achieve that the first OLED display panel 1 and the second OLED display panel 2 are bonded to each other and share the shared cathode layer 00, thereby obtaining the double-sided display device, wherein the fourth ETL 212 and the third ETL 211 are laminated and connected to form a second ETL 21 of the second OLED display panel 2.

In the above-mentioned manufacturing process, the first OLED display panel 1 and the second OLED display panel 2 are bonded and coupled to each other by two ETLs 211 and 212. Since the third ETL 211 is manufactured on the shared cathode layer 00 according to the conventional manufacturing process at first, the second ETL 21 of the second OLED display panel 2 and the shared cathode layer 00 have a good electrical connection performance, so that the first OLED display panel 1 and the second OLED display panel 2 can share the same cathode layer 00 while ensuring the good electrical connection performance.

In the present embodiment, in the step S4, the bonding and connecting the fourth ETL 212 to the third ETL 211 specifically includes the following steps:

S41: referring to FIG. 2C, manufacturing a first transparent electronic adhesive layer 213a on the third ETL 211, wherein the first transparent electronic adhesive layer 213a may be manufactured by coating.

S42: referring to FIG. 2B, manufacturing a second transparent electronic adhesive layer 213b on the fourth ETL 212, wherein the second transparent electronic adhesive layer 213b may be manufactured by coating.

S43: referring to FIG. 2D, pressing the second transparent electronic adhesive layer 213b toward the first transparent electronic adhesive layer 213a, and performing high temperature baking to make the first and second transparent electronic adhesive layers 213a and 213b mutually fuse into one to form a transparent electronic adhesive layer 213, wherein the high temperature baking is performed at a temperature of 80 to 150° C. for 1 to 5 min.

A thickness of the first transparent electronic adhesive layer 213a is selected to be 5 to 50 nm, and a thickness of the second transparent electronic adhesive layer 213b is selected to be 5 to 50 nm. Specifically, materials of the first transparent electronic adhesive layer 213a and the second transparent electronic adhesive layer 213b are preferable to have performances of high transparency and high carrier mobility, which may be selected as sorbitol (D-sorbitol) or dimethyl sulfoxide (DMSO). The materials of the first transparent electronic adhesive layer 213a and the second transparent electronic adhesive layer 213b may be selected as the same material, for example, both are selected as sorbitol or dimethyl sulfoxide, or may be selected as different materials, for example, the first transparent electronic adhesive layer 213a is selected as sorbitol, and the second transparent electronic adhesive layer 213b is selected as dimethyl sulfoxide.

Figure 3:
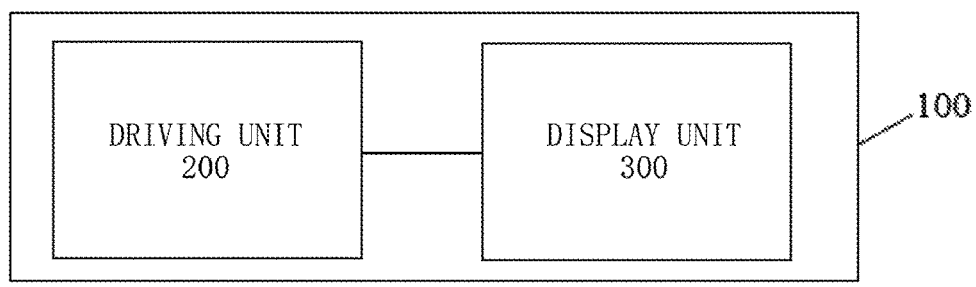
FIG. 3 is a structural diagram of an electronic apparatus provided by an embodiment of the present disclosure.

Furthermore, the present embodiment further provides an electronic apparatus. As shown in FIG. 3, the electronic apparatus includes a housing 100, and a driving unit 200 and a display unit 300 packaged in the housing 100, wherein the display unit 300 adopts the double-sided display device provided by the embodiment of the present disclosure. In particular, the driving unit 200 provides a driving signal to the display unit 300 such that the display unit 300 displays an image.

In conclusion, according to the double-sided display device and the manufacturing method thereof provided by the embodiments of the present disclosure, the first OLED display panel and second OLED display panel which are opposite to each other have a common shared cathode layer, thereby obtaining a double-sided display device having the lighter weight and the thinner thickness with a simple and easily implementable manufacturing process and a reduced manufacturing cost, and thus the requirements for thinness and high cost performance of customers are satisfied.

It should be explained that the relationship terms, such as first and second, etc., in the present text are only used for distinguishing one entity or operation from another entity or operation without necessarily requiring or implying any actual relation or sequence existing between these entities or operations. Moreover, the term "include", "contain" or any other variant means covering instead of exclusively including, so that the process, method, object or device including a series of factors not only includes those factors but also includes other factors that are not explicitly listed or further include inherent factors for this process, method, object or device. Where no more limitations are provided, the factors defined by the sentence "include one . . . " do not exclude additional identical factors existing in the process, method, object or device which includes the factors.

The above statements are only the specific embodiments of the present application, it should be pointed out that, to those ordinary skilled in the art, several improvements and polish can be made without breaking away from the principle of the present application, also those improvements and polish should also be deemed to be the protection scope of the present application.

What is claimed is:

1. A double-sided display device comprising a first OLED display panel and a second OLED display panel, of which display surfaces are disposed facing away from each other,
   wherein the first and second OLED display panels have a common shared cathode layer;
      the first OLED display panel comprises a first electron transport layer, a first emissive layer, a first hole transport layer, a first anode layer and a first array substrate that are sequentially laminated on a first surface of the common shared cathode layer; and
      the second OLED display panel comprises a second electron transport layer, a second emissive layer, a second hole transport layer, a second anode layer and a second array substrate that are sequentially laminated on a second surface of the common shared cathode layer,
   wherein the second surface is a surface opposite to the first surface, and
   wherein the second electron transport layer comprises a third electron transport layer and a fourth electron transport layer that are sequentially laminated one another, wherein the third electron transport layer and the fourth electron transport layer are bonded to each other via a transparent electronic adhesive layer.

2. The double-sided display device of claim 1, wherein a thickness of the transparent electronic adhesive layer is 10 to 100 nm.

3. The double-sided display device of claim 1, wherein a material of the transparent electronic adhesive layer is sorbitol or dimethyl sulfoxide.

4. The double-sided display device of claim 1, wherein the first array substrate and the second array substrate each is a thin film transistor array substrate, the first anode layer and the second anode layer each includes a plurality of anodes disposed in array, and the first emissive layer and the second emissive layer each includes a plurality of red emissive units, a plurality of green emissive units and a plurality of blue emissive units disposed in array.

5. An electronic apparatus, comprising a housing and a driving unit and a display unit packaged in the housing, the driving unit provides a driving signal to the display unit such that the display unit displays an image, wherein the display unit is a double-sided display device, the double-sided display device comprising a first OLED display panel and a second OLED display panel, of which display surfaces are disposed facing away from each other, wherein the first and second OLED display panels have a shared common cathode layer;
   the first OLED display panel comprises a first electron transport layer, a first emissive layer, a first hole transport layer, a first anode layer and a first array substrate that are sequentially laminated on a first surface of the shared common cathode layer; and
   the second OLED display panel comprises a second electron transport layer, a second emissive layer, a second hole transport layer, a second anode layer and a second array substrate that are sequentially laminated on a second surface of the shared common cathode layer, wherein the second surface is a surface opposite to the first surface, and wherein the second electron transport layer comprises a third electron transport layer and a fourth electron transport layer that are sequentially laminated one another, wherein the third electron transport layer and the fourth electron transport layer are bonded to each other via a transparent electronic adhesive layer.

6. The electronic apparatus of claim 5, wherein a thickness of the transparent electronic adhesive layer is 10 to 100 nm.

7. The electronic apparatus of claim 5, wherein a material of the transparent electronic adhesive layer is sorbitol or dimethyl sulfoxide.

8. The electronic apparatus of claim 5, wherein the first array substrate and the second array substrate each is a thin film transistor array substrate, the first anode layer and the second anode layer each comprises a plurality of anodes disposed in array, and the first emissive layer and the second emissive layer each comprises a plurality of red emissive units, a plurality of green emissive units and a plurality of blue emissive units disposed in array.

* * * * *